United States Patent [19]

Kobayashi et al.

[11] 4,437,603

[45] Mar. 20, 1984

[54] AUTOMATIC WIRING MACHINE FOR PRINTED CIRCUIT BOARDS

[75] Inventors: Mamoru Kobayashi, Hadano; Kanji Ishige, Kanagawa; Hideaki Sasaki; Mitsukiyo Tani, both of Hadano; Yashuhiko Kawakami, Yokohama, all of Japan

[73] Assignee: Hitachi, Ltd., Tokyo, Japan

[21] Appl. No.: 221,458

[22] Filed: Dec. 30, 1980

[30] Foreign Application Priority Data

Jan. 7, 1980 [JP] Japan .................................. 55-130

[51] Int. Cl.³ ............................................ H05K 13/06
[52] U.S. Cl. ...................................... 228/4.5; 29/850; 228/105; 228/8
[58] Field of Search ................... 228/1 R, 4.5, 105, 8; 29/850

[56] References Cited

U.S. PATENT DOCUMENTS

| | | | |
|---|---|---|---|
| 3,646,307 | 2/1972 | Hazel | 228/1 R X |
| 3,960,309 | 6/1976 | Hazel | 228/4.5 X |
| 4,031,612 | 6/1977 | Nicolas | 29/850 |
| 4,098,447 | 7/1978 | Edson et al. | 228/4.5 |
| 4,239,144 | 12/1980 | Elles et al. | 228/1 R |

FOREIGN PATENT DOCUMENTS

| | | | |
|---|---|---|---|
| 55-59731 | 5/1980 | Japan | 228/105 |
| 55-70493 | 5/1980 | Japan | 228/105 |

*Primary Examiner*—Kenneth J. Ramsey
*Attorney, Agent, or Firm*—Antonelli, Terry & Wands

[57] ABSTRACT

A machine for automatically wiring an insulated fine wire as thin as a hair on the printed circuit board of wiring patterns are set up between adjacent conductor printed circuit board to be applied with wirings is carried by an X-Y table which is movable in X and Y directions, and the X-Y table is moved in accordance with wiring sites. A wire guide unit, a bonding unit and a wire cutter unit mounted, above the X-Y table, to a head rotatably supported about an axis perpendicular to the X-Y table surface are rotated along with the head so as to be oriented in various directions an optical device is supported for optical monitoring of the operations from above along the rotational axis of the bonding head. The wire guide unit sequentially pays out the insulated fine wire onto the printed circuit board carried by the X-Y table, the bonding unit exposes the core of the payed-out insulated wire and fuses the wire for connection thereof to the conductor pad of the printed circuit board by heating and depressing the payed-out wire, and the wire cutter unit cuts away the wire after completion of wiring.

6 Claims, 19 Drawing Figures

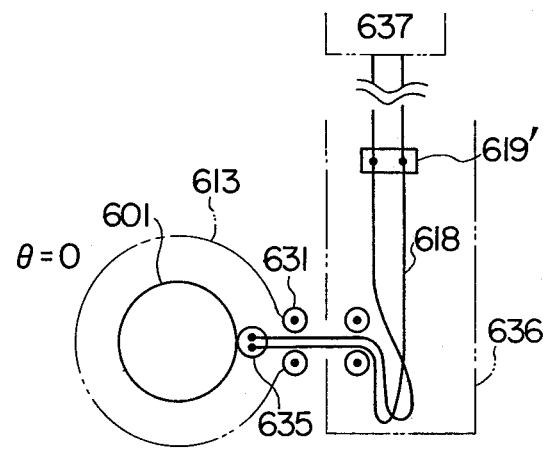
FIG. 15a
FIG. 13
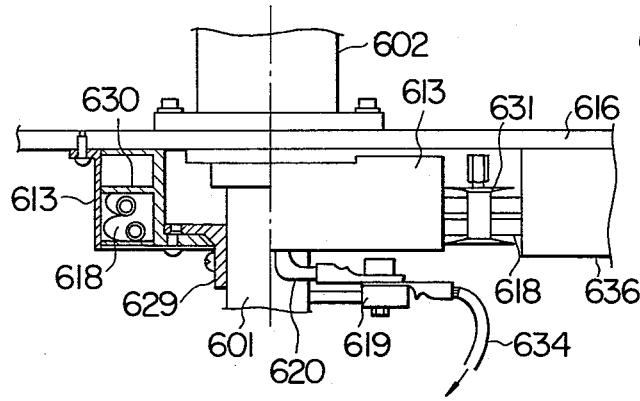
FIG. 15b
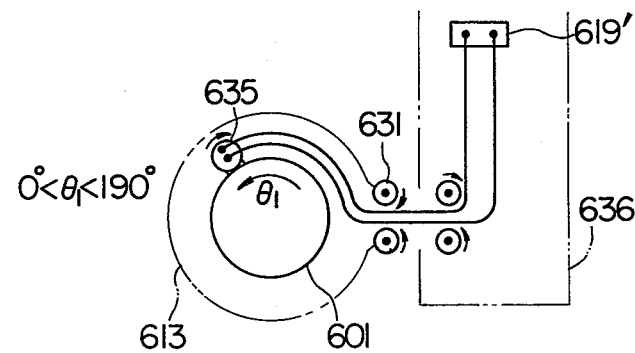
FIG. 14
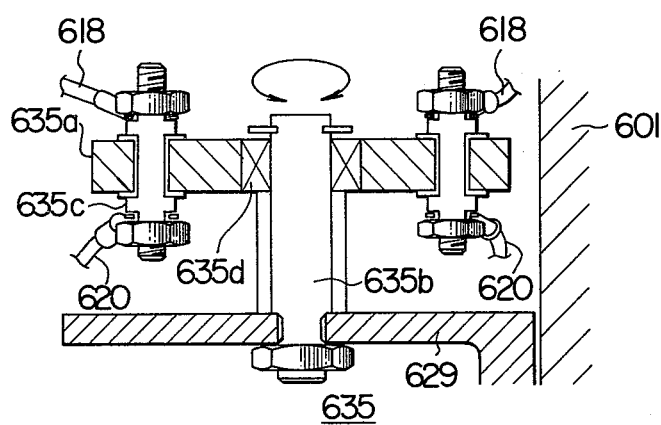
FIG. 15c
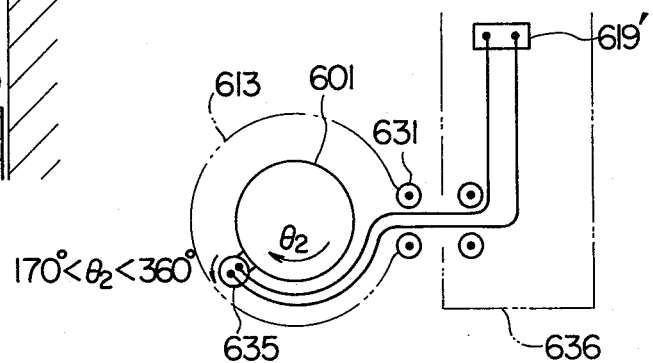

AUTOMATIC WIRING MACHINE FOR PRINTED CIRCUIT BOARDS

BACKGROUND OF THE INVENTION

The present invention relates to an automatic wiring machine for bonding connection of wires of a wiring pattern to a printed circuit board and more particularly a machine for automatic wiring of insulated fine wires on a highly populated printed circuit board.

In recent years, highly advanced function and performance have been required for electronic apparatus such as electronic computers, electronic exchangers and data communication instruments. With this trend, an electronic circuitry therefor has necessarily become highly populated, giving rise to a highly populated printed circuit board which accommodates the electronic circuitry. The highly populated printed circuit board has, for example, a high density wiring in which a great number of about 1 mm diameter conductor pads on the top of the board are spaced apart from each other at a distance of 2 mm with each pad connected to a plated through-hole in communication with the rear surface, and a plurality of wiring pattern conductors are set up between adjacent pads. Should a manual working be employed for setting up additional connections and wirings of an insulated fine wire as thin as hair on the printed circuit board having a high density printed wiring pattern, unconquerable troubles result including erroneous connections, defective connections and inadvertent bridging (short-circuit) to uninterested wiring patterns.

SUMMARY OF THE INVENTION

Accordingly, it is an object of the present invention to provide an automatic wiring machine which can set up unerring, highly precise wirings on the highly populated printed circuit board without resort to any manual working.

This type of an automatic wiring machine has not hitherto been known yet and is novel. Existing machines set up wrapping terminals on a printed circuit board and carry out an automatic wiring through the use of wrapping wiring, but this is not the case with the present invention wherein wirings are directly applied on the printed circuit board surface. In tailoring the wrapping connection to the highly populated printed circuit board, many difficulties are encountered in which the wire cover is difficult to be removed from the very fine insulated wire used and the wrapping terminal is very thin and mechanically weak.

Essentially, for formation of a wiring on the printed circuit board, a conductor pattern is formed on an insulating substrate by printed wiring technique such as etching. But, if the majority of conductor patterns for intended purposes are all formed on the substrate, a resulting electric circuitry becomes fixed and restricts versatility of the function of the electric device incorporating the electronic circuitry. Accordingly, it is desired to apply on one printed circuit board an additional or altered wiring which is compatible with an optional function as requested by users or with circuit parts required for a coming extension of circuit design, thereby permitting the one circuit board to have versatility for various functions. Also, design error often forces somewhat alternations in initially designed logic circuits. Especially, updating of the initially designed printed circuit boards used in a recent large-scale electronic device towards the necessary alternations disadvantageously raises manufacturing costs. Thus, the possibility of altering the initial design by wiring is an economic expedient for highly advanced electronic devices.

BRIEF DESCRIPTION OF THE DRAWINGS

FIG. 13 is a fragmentary sectional view showing a device for housing cables adapted to transmit large bonding current to the working units.

FIG. 14 is an enlarged sectional view of a rotor junction terminal of the FIG. 13 device.

FIGS. 15a to 15c are diagrammatic representations useful in explaining the manner of housing the cables.

DESCRIPTION OF PREFERRED EMBODIMENTS

Figure 1:
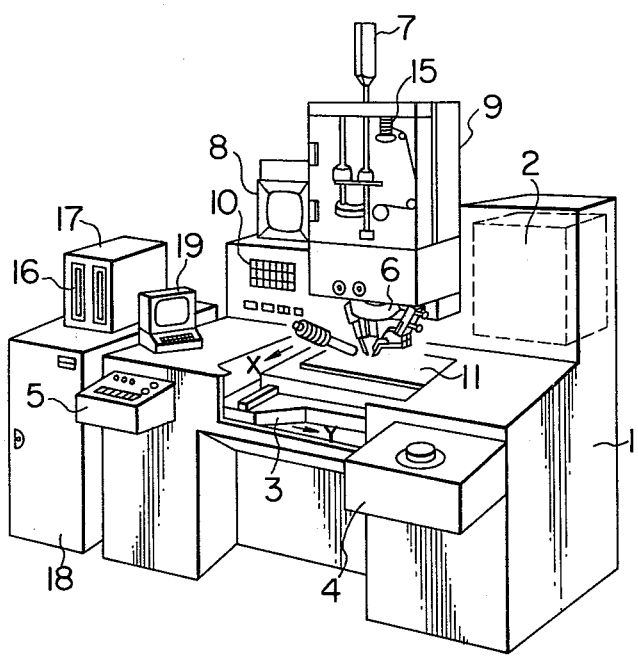
FIG. 1 is an overall perspective view of an automatic wiring machine for printed circuit board embodying the invention.
Figure 2:
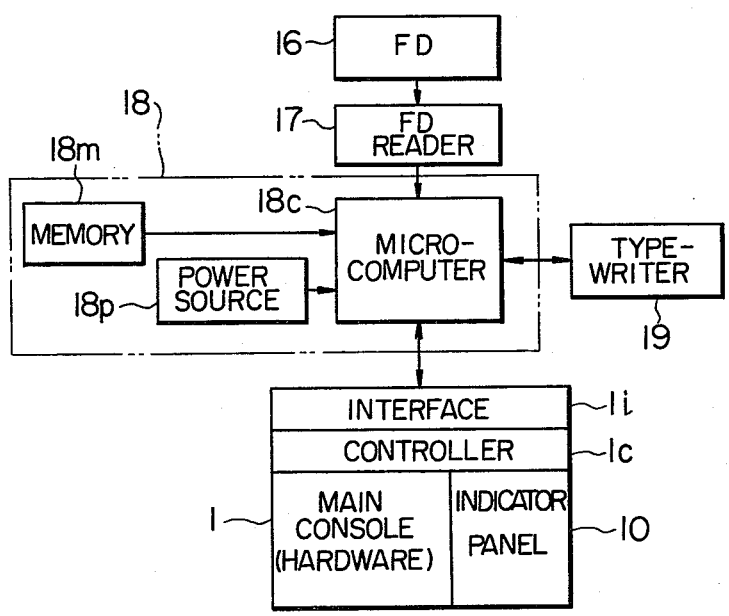
FIG. 2 is a schematic block diagram of the machine of FIG. 1.

Referring now to FIGS. 1 and 2, an automatic wiring machine embodying the invention will be described. The automatic wiring machine as shown in FIG. 1 comprises a main console 1, an X-Y table 3 carrying a printed circuit board 11 and movable in X and Y directions, a head 6 mounted with various working units for carrying out bonding joint of a wire to the printed circuit board which is positioned by means of the X-Y table, a wire feeder 9 for feeding the wire by way of the head, a TV camera 7 for viewing the surface of the printed circuit board 11 by way of a pipe which passed through a central portion of the head 6 and has an optical lens system built therein, a monitor TV receiver 8 for magnification and display of an image of the printed circuit board surface produced from the TV camera, displays on the monitor TV receiver being monitored by the operator, a chessman 4, which is by itself known in the art, adapted for manual fine adjustment of the position of the printed circuit board 11 on the X-Y table 3, a low-voltage and large-current power supply 2 for generating bonding heat, an operation panel 5 provided with operation buttons and the like for operating the automatic wiring machine, an indicator panel 10 provided with lamps for indicating the operation state of the automatic wiring machine, a floppy disk (FD) reader 17 for reading data recorded on a floppy disk 16 set in the reader, an FD control 18 incorporating a power source 18p, a memory 18m and a microcomputer 18c and connected to the main console 1 via an interface 1i and a controller 1c as shown in FIG. 2, for controlling the FD reader 17, and a console typewriter 19 adapted to supply the microcomputer 18c of FD control 18 (FIG. 2) with various operation instructions.

Figure 3:
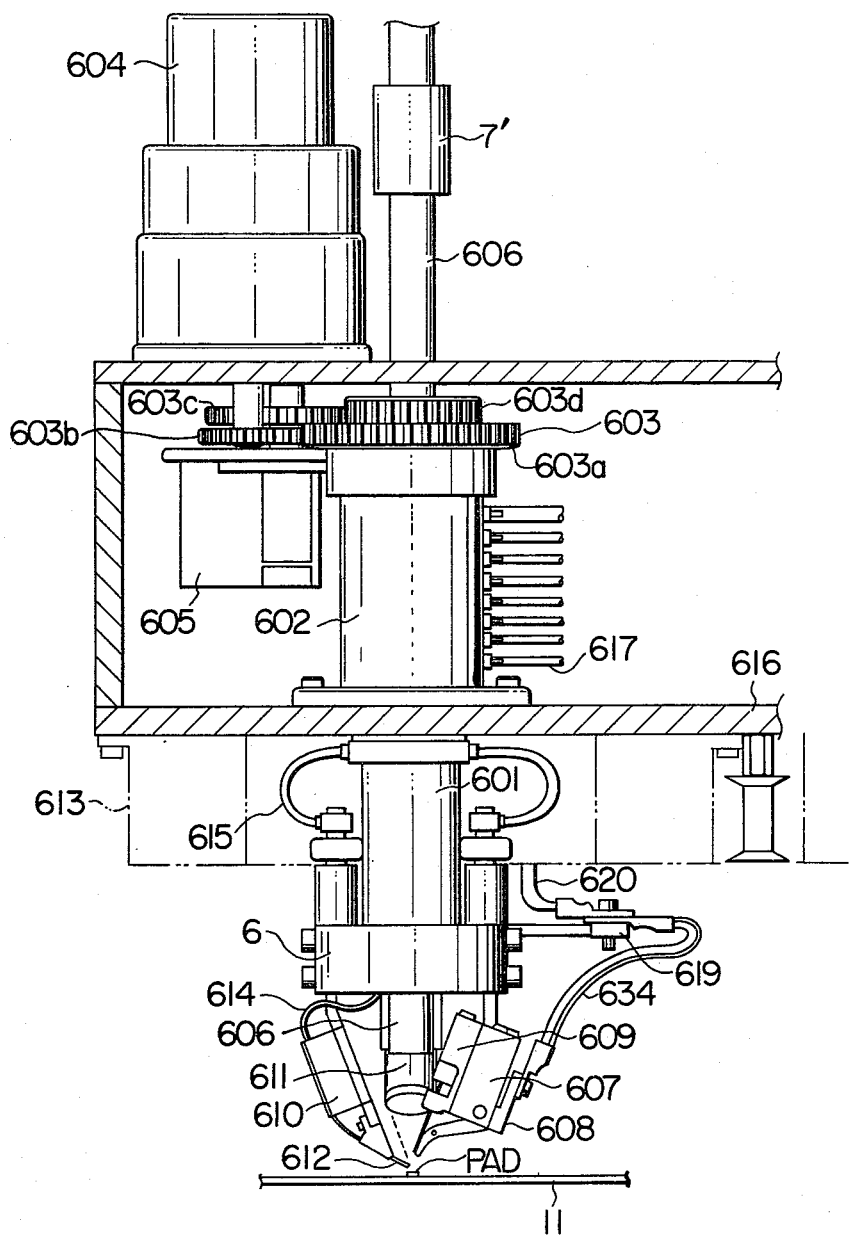
FIG. 3 is a fragmentary view showing, partly in section, a head of the FIG. 1 machine along with associated component elements.

The head 6 is associated with peripheral elements as shown in FIG. 3. Fixedly supported within a case 616 of the main console is a stationary cylindrical shaft 602 within which a rotary cylindrical shaft 60 is rotatably mounted. A monitor lens pipe 606 fixed to the case 616 passes through central portions of the rotary cylindrical shaft 601 and head 6. A focusing adjustment portion 7' of the TV camera 7 is shown in a part of the monitor lens pipe 606. The head 6 is mounted to the bottom of the rotary cylindrical shaft 601 and provided with a bonding unit 607, a wire cutter unit 609, and a wire guide unit 610, all of the working units being arranged circumferentially of a lower portion of the monitor lens pipe. An illumination unit 611 adapted to iluminate a wired surface of the printed circuit board 11 is mounted to the case 616, for emitting illumination light which is obliquely incident to the wired surface. The illumination unit 611 is so positioned as to make room for motion of the working units. But alternatively, it may be mounted to the head 6 for rotation along with those working units. A pulse motor 604 drives a gear 603b which in turn rotates, via a gear 603a, the rotary cylindrical shaft 601 mounted with the head 6. A pulse generator 605 is driven, via a gear 603c, by a gear 603d fixed to the rotary cylindrical shaft 601 for rotation thereby and it generates a number of pulses in proportion to a rotational angle of the rotary cylindrical shaft 601, thereby detecting the rotational position of the rotary cylindrical shaft 601. Thus, the rotational angular position of each of the working units mounted to the head 6 can be measured by counting the pulses. The respective working units 607, 609 and 610 are powered by air pressure to perform various operations to be described later. Pressurized air applied to a number of air inlet pipes 617 mounted to the outer peripheral surface of the stationary cylindrical shaft 602 is sent to a number of air transmission tubes 615 via an air pressure transmission device to be described later and fed to each of the working units via the head 6. A wire guide pipe 614 establishes a wire path through which a wire for bonding wiring is fed to a wire guide 612 at the tip of the wire guide unit 610. Large-diametered cables 634 for suppply of current for bonding heat are connected from a bonding holder 608 to the low-voltage and large-current power supply 2 included in the main console (FIG. 1) via junction terminals 619, cables 620, and a movable connector device (to be described later) built in a case 613.

Figure 4:
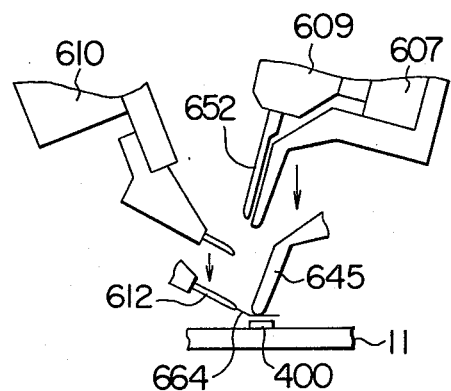
FIGS. 4 and 5 are diagrammatic representations useful in explaining the manner of applying wiring on a printed circuit board.
Figure 5:
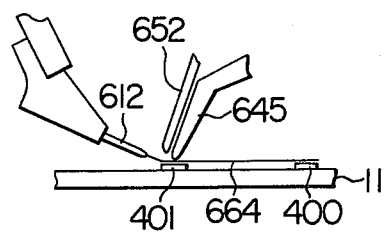

Prior to describing each of the working units in detail, the operation of these units will first be outlined with reference to FIGS. 5 and 5. As shown in FIG. 4, a predetermined length of a bonding wire 664 is drawn out of the tip guide 612 of wire guide unit 610, and the wire guide unit 610 is lowered until the wire 664 comes into contact with a conductive pad 400 to be bonded therewith. Under this condition, the bonding unit 607 is lowered by a predetermined stroke so that a bonding tip 645 is pressed against the pad 400, and current is padded through the tip 645. This current flow heats the tip 645 and the wire 664 can be connected to the conductive pad 400. By applying a solder material to the conductive pad 400 in advance, the connection of the wire 664 with the conductive pad 400 can be completed by soldering without resort to external supply of a solder. Also, the wire 664 is preferably covered with a resin material such as polyurethane which is molten and removed at melting temperatures of the solder. The core of the wire 664 is then partly exposed at a portion to be soldered by the heated tip 645, thus eliminating necessity for any additional cover removal workings. Thereafter, the printed circuit board 11 is moved to the right as viewed in FIG. 4 until the other end of the wire 664 rests on another conductive pad 401 as shown in FIG. 5. The tip 645 is again lowered, current is passed through the tip 645 to generate heat therein, and the wire 664 is soldered to the pad 401. Subsequently, the wire cutter unit 609 (FIG. 4) is lowered and a cutter 652 at the tip of the unit 609 is pressed down to cut the wire 645.

Figure 6:
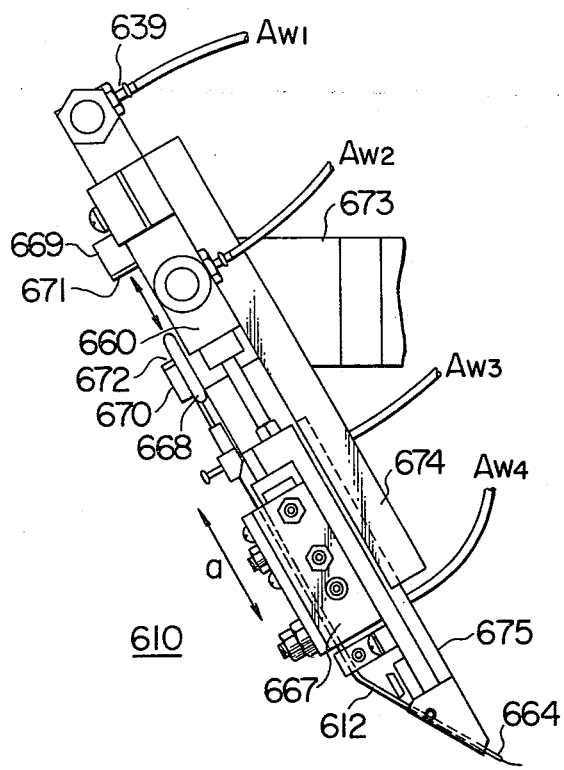
FIG. 6 is a front view showing details of a wiring guide unit as shown in FIG. 3.
Figure 7:
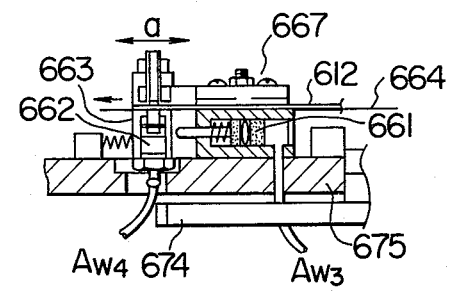
FIG. 7 is a sectional view showing details of a wire pay-out device as shown in FIG. 6.
Figure 8:
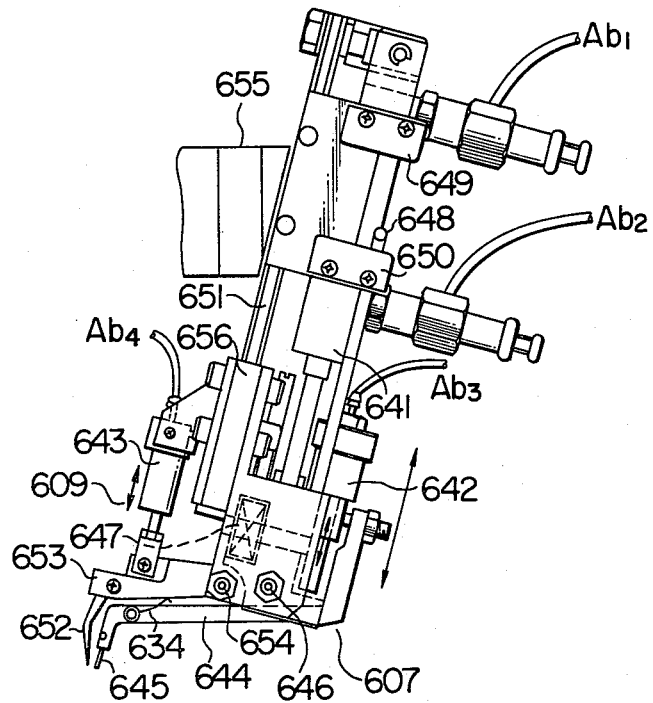
FIG. 8 is a front view showing details of a bonding unit and a cutter unit as shown in FIG. 3.

The working units for carrying out the operation as outlined above will be described in detail with reference to FIGS. 6 to 8. Shown in FIG. 6 is a front view of the wire guide unit 610. Shown in FIG. 7 is a sectional view of a wire pay-out device 667 of the unit 610. Shown in FIG. 8 is a front view of an assemblage of the cutter unit 609 and bonding unit 607. With reference to FIG. 6, the wire guide unit 610 comprises a support rail 674 obliquely mounted to the head 6 (FIG. 3) at a fixed angle via a support member 673, a carriage 675 slidably supported by the rail 674, and a cylinder 660 fixed to the rail 674 and operable to reciprocate the carriage 675 up and down along the rail 674. The wire pay-out device 667 integral with the carriage 675 pays out the wire 664 inserted in the wire guide pipe 612. An arm 668 fixed to the carriage 675 engages an upper switch (microswitch) 669 or a lower switch 672 as the carriage 675 reciprocates so that the reciprocation of the carriage 675 can be checked by output signals from the switches. The cylinder 660 is driven by air fed from air pipes $AW_1$ and $AW_2$. For example, the cylinder 660 pulls out when air is supplied to the air pipe $AW_1$ and pulls back when air is supplied to the air pipe $AW_2$.

Figure 10:
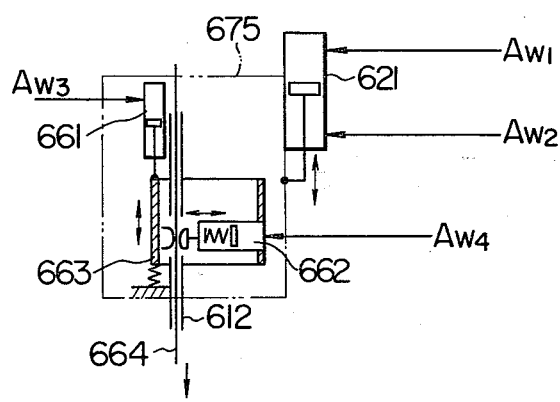
FIG. 10 is a schematic diagram useful in explaining the outlined operation of the FIG. 6 unit.

Details of the wire pay-out device 667 are best shown in FIG. 7. The wire pay-out device 667 fixed to the carriage 675 comprises a cylinder 662 acting as a clamper for the wire 664 and movably mounted for reciprocation in the longitudinal direction a of the carriage 675, and a cylinder 661 adapted to cause the cylinder 662 to move in the direction a. When air is supplied to the two cylinders via air pipes $AW_3$ and $AW_4$, the wire 664 is payed out. The operation of the wire guide unit 610 will be best understood from FIG. 10 which illustrates the construction of the unit 610 schematically. With reference to FIG. 10, when pressurized air is supplied to the air pipe $AW_1$, the cylinder 621 causes the carriage 675 to lower so that the wire guide 612 draws near the pad 400 (FIG. 4) on the printed circuit board 11. Subsequently, when pressurized air is supplied to the air pipe $AW_4$, the cylinder 662 clamps the wire 664. Under this condition, the cylinder 661 is operated by air pressure supplied to the air pipe $AW_3$ to cause a wire clamper 663 comprised of the cylinder 662 to lower to ensure that a predetermined length of the wire 664 is payed out.

Figure 9:
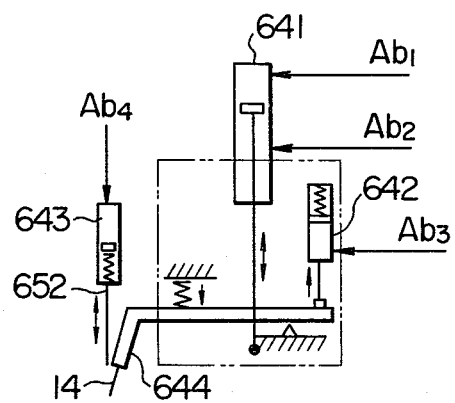
FIG. 9 is a schematic diagram useful in explaining the outlined operation of the FIG. 8 units.

Details of the assemblage of the cutter unit 609 and bonding unit 607 will be described with reference to FIG. 8. The assemblage comprises a rail 651 obliquely mounted to the head 6 (FIG. 1) at a fixed angle via a support member 655, a carriage 656 movably mounted on the rail 651 for up and down reciprocation and driven by a cylinder 641, a bonding arm 644 pivoted on a fulcrum 646 at a lower portion of the carriage and driven by a cylinder 642 for a seesaw motion, and a cutter arm 653 pivoted on another fulcrum 654 and driven by a cylinder 643 for a seesaw motion. Secured to the tip of the cutter arm 653 is a cutter 652. The posture of the cutter 652 is pre-adjusted such that when the cutter arm 653 is subject to downward seesaw motion caused by the cylinder 643, the cutter 652 comes across the printed circuit board surface substantially along the normal thereof after tracing an arcuate lows. Secured to the tip of the bonding arm 644 is a bonding tip 645. The posture of the bonding tip 645 is also pre-adjusted such that when the bonding arm 644 is subject to downward seesaw motion caused by the cylinder 642, the bonding tip 645 comes across the printed circuit board surface substantially along the normal thereof after tracing an arcurate lows. By this normal or vertical action (depression) on the printed circuit board, it is possible to prevent inadvertent displacement of the wire and deviation of the cutter 652 and the tip 645 from aimed positions, thus ensuring precise bonding and wire cutting. A spring 647 biases the arm 644 such that the bonding tip 645 has tendency to downward seesaw motion but the cylinder 642 normally pulls out to push the righthand end, as viewed from FIG. 8, of the arm 644. When bonding, air pressure in a pipe $Ab_3$ is reduced and the cylinder 642 pulls back. As a result, depression force due to the spring 647 alone causes the downward seesaw motion. Such an expedient ensures that the wire bonding is always carried out under the application of constant depression force. The above operation is schematically shown in FIG. 9. In bonding a fine wire as thin as a hair, the magnitude of the depression force significantly affects reliability of finished connection. In particular, if the depression force is excessively large, the bonding action breaks the wire or damages the pad. Conversely, if excessively small, poor heat transfer results which prevents a flow solder applied on the pad top from being molten, giving rise to defective bonding. Accordingly, it is of great significance to make the depression force constant in order that precise wirings can be applied on a printed circuit board with a high density circuit pattern. Air pressure fed from an air pipe $Ab_1$ lowers the carriage 656 mounted with the cutter unit 609 and the bonding unit 607 whereas air pressure fed from an air pipe $Ab_2$ raises the carriage 656. Air pressure fed from the air pipe $Ab_3$ normally pulls up the left hand end of the bonding arm 644 and it is reduced, when bonding, to lower the same. Air pressure fed from an air pipe $Ab_4$ lowers the cutter arm 653. These air pipes receive pressurized air from the majority of corresponding pipings 615 as shown in FIG. 3.

Figure 11:
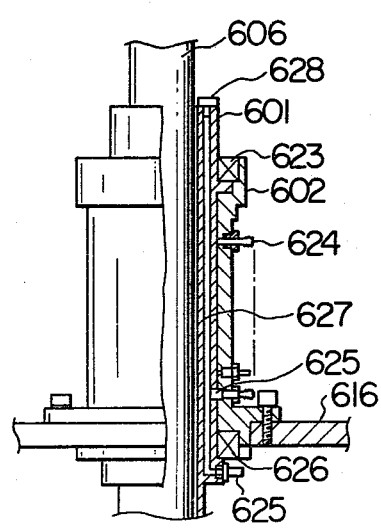
FIGS. 11 and 12 are sectinal views showing a device for transmission of air pressure to the rotary head.
Figure 12:
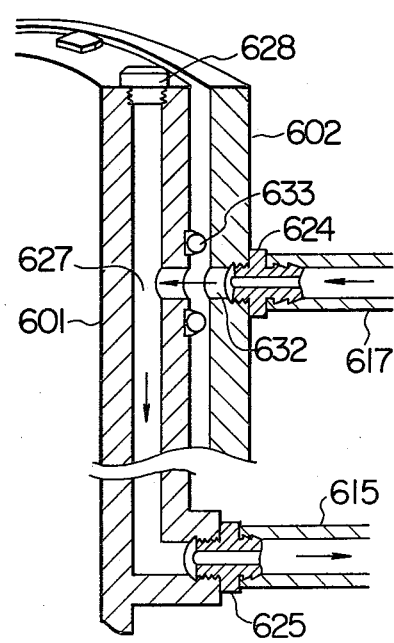

To describe the air transmission device between the stationary cylindrical shaft 602 (FIG. 3) and the rotary cylindrical shaft 601 (FIG. 3) rotatably supported therein, reference is made to FIG. 11 illustrating, in partial sectional form, the incorporation of the rotary cylindrical shaft 601 in the stationary cylindrical shaft 602 and to FIG. 12 illustrating a partial sectional enlargement of FIG. 11. As shown in FIG. 11, a number of air inlet port 624 are provided in the wall of the stationary cylindrical shaft 602 and the air inlet pipes 617 as shown in FIG. 3 are connected to these inlet ports. The stationary cylindrical shaft 602 is fixed to the main console case 616, and the rotary cylindrical shaft 601 is rotatably supported within the shaft 602 by means of thrust bearings 623 and 626. Formed in the wall of the rotary cylindrical shaft are a number of circumferentially spaced, independent longitudinal borings 627. Each of the borings 627 has an upper opening sealed with a sealing screw 625 and is in communication with the air inlet ports 624 via lateral holes passing through the walls of the rotary and stationary cylindrical shafts. A lower opening of the longitudinal boring 627 is in communication with an air inlet port 625 which in turn is connected with the air pipe 615 as shown in FIG. 3. Air transmission between the longitudinal boring 627 in the rotary cylindrical shaft 601 and the lateral hole 632 extending through the wall of the stationary cylindrical shaft 602 is effected with an air transmission device as will be described with reference to FIG. 12. Thus, the spacing between the rotary cylindrical shaft 601 and the stationary cylindrical shaft 602 is partitioned by a number of O-ring gaskets 633 applied around the rotary cylindrical shaft 601 so that pressurized air is transmitted, without leakage, from one lateral hole 632 to the associated one longitudinal boring 627 through an annular cavity defined by two O-ring gaskets 633 which are positioned above and below the hole 632. This annular cavity prevents leakage and assures transmission of pressurized air from the lateral hole 632 in the stationary cylindrical shaft 602 to the corresponding longitudinal boring 627 even when the rotary cylindrical shaft 601 rotates and the longitudinal boring 627 shifts circumferentially. Formed in the inner wall surface of the stationary cylindrical shaft 602 or in the outer wall surface of the rotary cylindrical shaft 601 are circumferential recesses in which the O-ring gaskets 633 are snugly seated. Consequently, these gaskets will not displace vertically.

For supply of low-voltage and large-current power to the bonding unit 607 which is rotatable along with the head 6, a movable connection device is employed which will be described with reference to FIGS. 13, 14 and 15. FIG. 13 shows, partly in section, the movable connection device, FIG. 14 shows a partial section of the device, and FIG. 15 shows the operation of the device. Referring to FIG. 13, a rotatable cylindrical casing 630 is secured to the outer periphery of the rotary cylindrical shaft 601 through an angle bar 629 and defines a circumferential space in which cables 618 are reeled. The stationary case 613 (illustrated at chained line in FIG. 3) fixed to the main console case 616 acts as a guard against escape of the cables 618 from the circumferential space. Each of the cables 618 is payed out of another stationary casing 636 and led to the circumferential space defined by the stationary case 613 and the rotatable casing 630 by way of a guide roller 631, terminating in a tip connected to a rotor terminal 635 (FIG. 14) which is rotatably mounted to the angle bar 629. The cable 618 is connected through the rotor terminal 635 to the cable 620 which in turn is connected to the junction terminal 619 secured to the rotary cylindrical shaft 601. The rotor terminal 635 is designed to rotate about its axis to ensure that slack of the cable connection at this terminal can be prevented and the cables 618 and 620 can readily be drawn around circumferentially within the casing 613 as shown in FIG. 15. The rotor terminal 635 comprises an upright post 635b mounted to the angle bar 629 secured to the rotary cylindrical shaft 601, an insulator disk rotatably mounted to the upper portion of the post 635b through a bearing 635d, and two connection terminal pins 635c studded in the disk 635a. The terminal pin 635c has its upper portion connected with the cable 618 extending from the stationary casing 636 and its lower portion connected with the cable 620 extending from the junction terminal 619. The terminal pin 635c is fixedly secured to the disk 635a but more preferably, it may be rotatably mounted to the disk 635a so that the cables can be drawn around more smoothly. The cables 618 extending from the stationary casing 636 are drawn around within the casing 613 as will be explained with reference to FIGS. 15a, 15b and 15c. When the rotor terminal 635 is positioned in the most proximity of a cable outlet, that is, in the most proximity of the roller 631, the cables 618 are mostly folded arcuately within the casing 636 as shown in FIG. 15a. As the rotary cylindrical shaft 601 rotates counterclockwise as shown in FIG. 15b, the rotor terminal 635 follows this rotation to thereby pull the cables 618 out of the stationary casing 636. When the cables are pulled out, the guide roller 631 rotates to follow the motion of the cables, thus guiding these cables being pulled out. In this embodiment, the rotor terminal 635 can rotate counterclockwise through 190° at the most and clockwise through −190° at the most. These rotation angles may obviously be increased by selecting diameter and hardness of the cable. When the state as shown in FIG. 15b shifts to the state as shown in FIG. 15c, the cables 618 are once pulled into the casing 636 by the clockwise rotation of the rotor terminal 635, attaining the state as shown in FIG. 15a, and thereafter pulled out to reach the state as shown in FIG. 15c. In this manner, the cable 618 terminates in the tip connected to the rotor terminal 635 which is rotatable about the axis of the rotary cylindrical shaft as well as about its own axis. Consequently, even with a large-diameter cable, the flexible connection thereof with the rotary member can be accomplished, thus making it possible to supply large current to loads carried by the rotary member without disturbing the rotation of the same.

Details of each of the component units of the machine embodying the invention have been described. The overall operation of the machine will now be described with reference to FIGS. 16 and 17 which respectively illustrate a flow chart of signals appearing in the operation and a logical arrangement practicing the flow chart.

A printed circuit board to be applied with wirings is first set on the X-Y table 3 as shown in FIG. 1 and the table 3 is moved to a desired position. A floppy disk 16 recording a wiring data is then inserted and set in the FD reader 17 as shown in FIG. 1. Next, when a start button (not shown) on the operation panel 5 is depressed, an operation start signal (not shown) is produced from the controller 1c as shown in FIG. 17 and sent to the microcomputer 18c via an input line 711 of the interface 1i, and the microcomputer 18c issues a read instruction 710 which is applied to the FD reader 17. When a predetermined amount of wiring designation data, for example, 64 words for designating 64 wiring lines are read out of the floppy disk (FD) 16 and written into the memory 18m via the FD reader 17, an operation in step ① of FIG. 16 starts. Operations subject to the subsequent steps of FIG. 6 are programmed in the microcomputer 18c and various instructions associated with the individual steps are produced from the microcomputer (hereinafter simply referred to as MC) 18c and sent to the controller 1c via the interface 1i. The controller 1c thus commands generation of mechanical driving power necessary for various components. The mechanical driving power generation is for driving a pulse motor $M_X$ operable to move the X-Y table 3 in the X direction, for driving a pulse motor $M_Y$ operable to move the table 3 in the Y direction, for switching air valves $V_0$ to $V_7$ for supply of air to the air pipes 617, and for supplying the large current for bonding.

The MC 18c reads one data (one word) out of the memory 18m (step ① of FIG. 16), fetches information regarding the direction of the pad from control information $C_0$ included in the read-out data, and computes a difference (a deviation angle $\Delta\theta$) between the fetched pad direction information and the present rotary angular position of the head 6 in order to set the difference in a control information block $\Delta C$. Similarly, the MC 18c fetches X address information $X_0$ and Y address information $Y_0$, and computes differences (deviation addresses) $\Delta x$ and $\Delta y$ from the present X and Y positions of the table 3. Thus, the differences $\Delta x$, $\Delta y$ and $\Delta\theta$ are transferred to information blocks $\Delta X$, $\Delta Y$ and $\Delta C$ of a register 701 included in the controller 1c via the interface 1i.

Subsequently, each time step ① of FIG. 16 occurs, the difference $\Delta\theta$ is transferred to the register 701 for inclusion into the control information block thereof. The information set in the control information block $\Delta C$ is fetched by a control circuit (CONT) 702. When the deviation angle $\Delta\theta$ fetched by the CONT 702 from the control information block $\Delta C$ is applied to a pulse generator ($PG_\theta$) 707, a number of pulses proportional to the deviation angle $\Delta\theta$ is applied to a pulse motor 604. The motor 604 is then driven by the pulses to rotate the head 6 via a gear 603 so that the head 6 is oriented to a pad subject to start of wiring (steps ② and ③ of FIG. 16). At this time, a pulse counter 605 counts the present rotary angular position of the head 6 via the gear 603, and a pulse signal 713 produced from the counter 605 is sent to the CONT 702 at which the pulse signal 713 is counted and a resulting count in the form of count information is transferred to the MC 18c via input line 711 of the interface 1i. When receiving the count information, the MC 18c updates the present information regarding the rotary angular position of the head 6 to the count information.

Thereafter, the CONT 702 issues signals 714 and 715 for enabling gates 703 and 704, and the address information $\Delta x$, $\Delta y$ set in information blocks $\Delta X$ and $\Delta Y$ of the register 701 is transferred to pulse generators $PG_X$ and $PG_Y$. The pulse generator $PG_X$ generates a pulse signal in proportion to the value of the address information $\Delta x$ and this pulse signal is applied to the pulse motor $MX$. Then, the pulse motor $M_X$ is driven by the pulse signal to move the table 3 in the X direction. Similarly, the pulse generator $PG_Y$ a pulse signal in proportion to the value of the address information $\Delta y$ to the pulse motor $M_Y$ which in turn moves the table 3 in the Y direction (step ④ of FIG. 16). When the above operation is completed, the pad 400 subject to start of wiring on the printed circuit board 11 is positioned in register with the action point of the individual working units as shown in FIG. 4.

Subsequently, the tip of the wire guide 612 included in the wire guide unit 610 is lowered (step ⑤ of FIG. 16) to approach the pad 400 as shown in FIG. 4. To this end, the CONT 702 shown in FIG. 17 fetches an instruction for the lowering of the wire guide from the control information block ΔC of the register 701 and produces a signal by which the air supply valve $V_0$ is opened a predetermined time duration. While the valve $V_0$ is kept opened by the signal within the predetermined time duration, air pressure from an air pressure generator AG is applied to the air supply pipe 617 via the valve $V_0$ and ultimately, exerts on the cylinder 660 via the pipe $AW_1$ as shown in FIG. 6 so that the cylinder 660 is pushed out to lower the wire guide carriage 675. Next, in order that the wire 664 is payed out as shown in FIG. 4, the CONT 702 shown in FIG. 17 fetches an instruction for pay-out of the wire from the control information block ΔC of the register 701 and opens the air supply valves $V_2$ and $V_3$ a predetermind time duration. Air pressure is then fed to the pipes $AW_3$ and $AW_4$ shown in FIGS. 6 and 7 and associated with the wire pay-out device 667. Consequently, the cylinder 662 clamps the wire 664 and the clamped wire is shifted by the cylinder 661 to the left, thereby paying out the wire 664 by a stroke of tht cylinder 661 (step ⑥ of FIG. 16). This operation of pay-out is checked by a wire tension variation sensor (not shown) incorporated in the wire feeder 9 as shown in FIG. 1, and a resulting pay-out confirmation signal is sent to the MC 18c via the CONT 702 and the input line 711 of interface 1i (step ⑦ of FIG. 16). When the MC 18c recognizes the absence of tht confirmation signal within a predetermind time duration, an error procedure is carried out to provide an error indication (not illustrated) on the indication panel 10 as shown in FIG. 1, leading to stoppage of the operation. In the presence of the confirmation signal, the CONT 702 fetches a bonding voltage instruction from the control information block ΔC of register 701 and applies a setting voltage to the power supply 2 as shown in FIG. 1 via a signal line 716. A bonding power source (BPS) 637 as shown in FIG. 15 is then placed into preparation for delivery of a voltage in conformity with the sizes of the wire and pad (step ⑧ of FIG. 16).

Subsequently, the bonding tip 645 is lowered as shown in FIG. 4 (step ⑨ of FIG. 16). The lowering of this tip 645 is performed by two steps including lowering the bonding unit 607 and pushing down (arcuately) the tip 645 mounted to the unit. Firstly, to lower the unit 607, a bonding unit lowering instruction received from the control information block ΔC of the register 701 produces a signal for opening the valve $V_4$ as shown in FIG. 17. When the valve $V_4$ is opened by this signal, air pressure is fed to the pipe $Ab_1$ as shown in FIG. 8 via the pipe 617 in a similar manner to the above, and the cylinder 641 is actuated to lower the carriage 656. In response thereto, the bonding arm 644 swings downwardly and the cutter arm 653 comes down. Next, to push down the bonding tip (step ⑩ of FIG. 16), the CONT 702 fetches a tip pushing down instruction from the control information block ΔC of register 701 and as a result, the valve $V_6$ is closed a predetermined time duration and reduction of air pressure is performed via the pipe $Ab_3$ as shown in FIG. 8. Accordingly, depression pressure exerting on the righthand end of the arm 644 is removed by the air pressure reduction within the cylinder 642, and the arm 644 swings downwardly by the action of the spring 647, thereby ensuring that the tip 645 secured to the lefthand end of the arm 644 pushes down the wire 664 onto the pad 400 subject to start of wiring as shown in FIG. 4. Thereafter, a bonding current application instruction is fetched from the control information block ΔC of the register 701 and a signal is applied to the power source (BPS) 637 via a signal line 717, for causing the BPS 637 set to the predetermined voltage to deliver out bonding current at a terminal 619' as shown in FIG. 15. The bonding current from the BPS 637 is fed to the tip 645 via cables 618, rotary junction terminal 635, cables 620 as shown in FIG. 14, junction terminal 619, cables 634 as shown in FIGS. 8 and 13, and arm 644, so as to generate Joule heat in the tip 645 which is depressing the wire 664 (step ⑪ of FIG. 16). The heated tip 645 heats the wire 664 and pad 400 as shown in FIG. 8. It therefore follows that concurrently with removal of molten insulator cover of the wire 664, solder pre-applied on the surface of pad 400 is fused to thereby solder the wire 664 to the pad 400.

Subsequently, when the CONT 702 fetches a bonding tip raising instruction from the control information block ΔC of register 701 to open the valve $V_6$, air pressure is admitted to the pipe $Ab_3$ assshown in FIG. 8 so as to cause the cylinder 642 to push down the righthand end of the arm 644 with the result that the tip 645 secured to the lefthand end of the bonding arm 644 is raised arcuately (step ⑫ of FIG. 16). Thereafter, the CONT 702 fetches a bonding unit raising instruction from the block ΔC to open the valve $V_5$. With the valve $V_5$ opened, air pressure is admitted to the pipe $Ab_2$ so as to cause the cylinder 641 to raise the carriage 656 along with the cutter arm 653 and bonding arm 644 mounted to the carriage 656 (step ⑬ of FIG. 16). In this manner, bonding the wire to the pad 400 subject to start of wiring is completed.

The wire 664 with one end bonded to the start pad 400 is then payed out until it reaches a termination pad 401 at which the wire is also bonded thereto and cut away as will be described below. The MC 18c first reads a second data, data 1, out of the memory 18m in order to fetch the subsequent one data (step ⑭ of FIG. 16). After reading out the data 1, the MC 18c computes, as described in connection with step ① of FIG. 16, deviation addresses Δx and Δy as well as a deviation angle Δθ, and transfers them to the register 701 of the controller 1c via the interface 1i. Subsequently, by tracing the same operation as has been described in connection with steps ②, ③ and ④, the head is oriented in the wiring direction (steps ⑮ and ⑯)), the X-Y table is moved (step ⑰)), and the wire 664 is applied across the pads 400 and 401 as shown in FIG. 5. As the X-Y table shifts (step ⑰)), the wire 664 is payed out of a wire bobbin 15 as shown in FIG. 5 and tension of the payed-out wire is checked by the tension sensor (step ⑱).

Next, a deviation angle from the pad 9 (FIG. 5) is computed (step ⑲)), as in steps ② and ③, and the head is rotated in accordance with the deviation angle (step ⑳)) to ensure that the direction of the wire 664 is matched with that of the pad 401. As has been described in connection with steps ⑥ through ⑫, the wire is payed out (step ㉑)), the payed-out wire is checked (step ㉒)), the bonding voltage is set (step ㉓)), the bonding unit is lowered (step ㉔)), the bonding tip is pushed down (step ㉕)), the bonding current is applied (step ㉖)), and the bonding tip is raised (step ㉗)).

Figure 16:
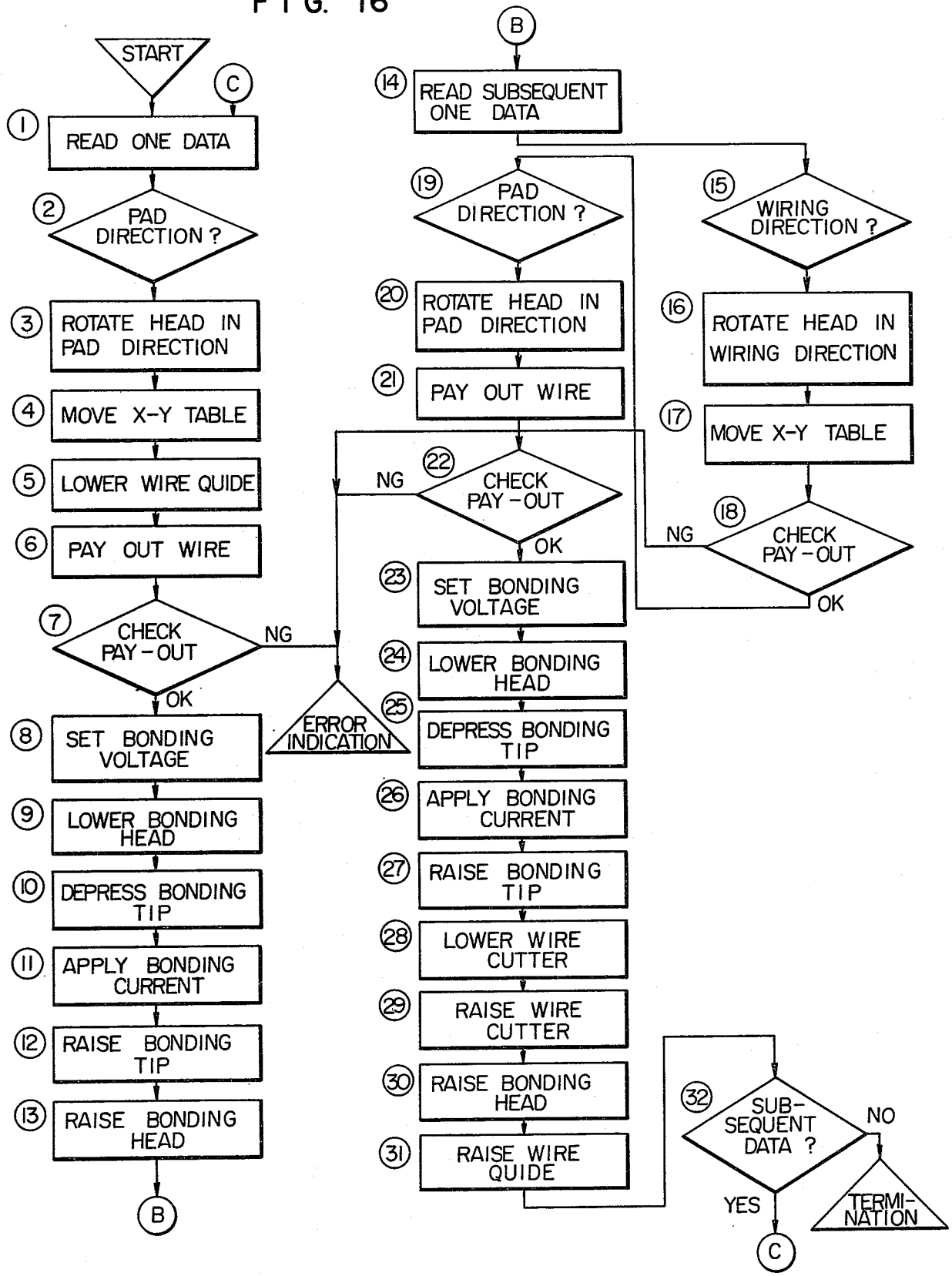
FIG. 16 is a flow chart useful in explaining the operation of the automatic wiring machine according to the invention.
Figure 17:
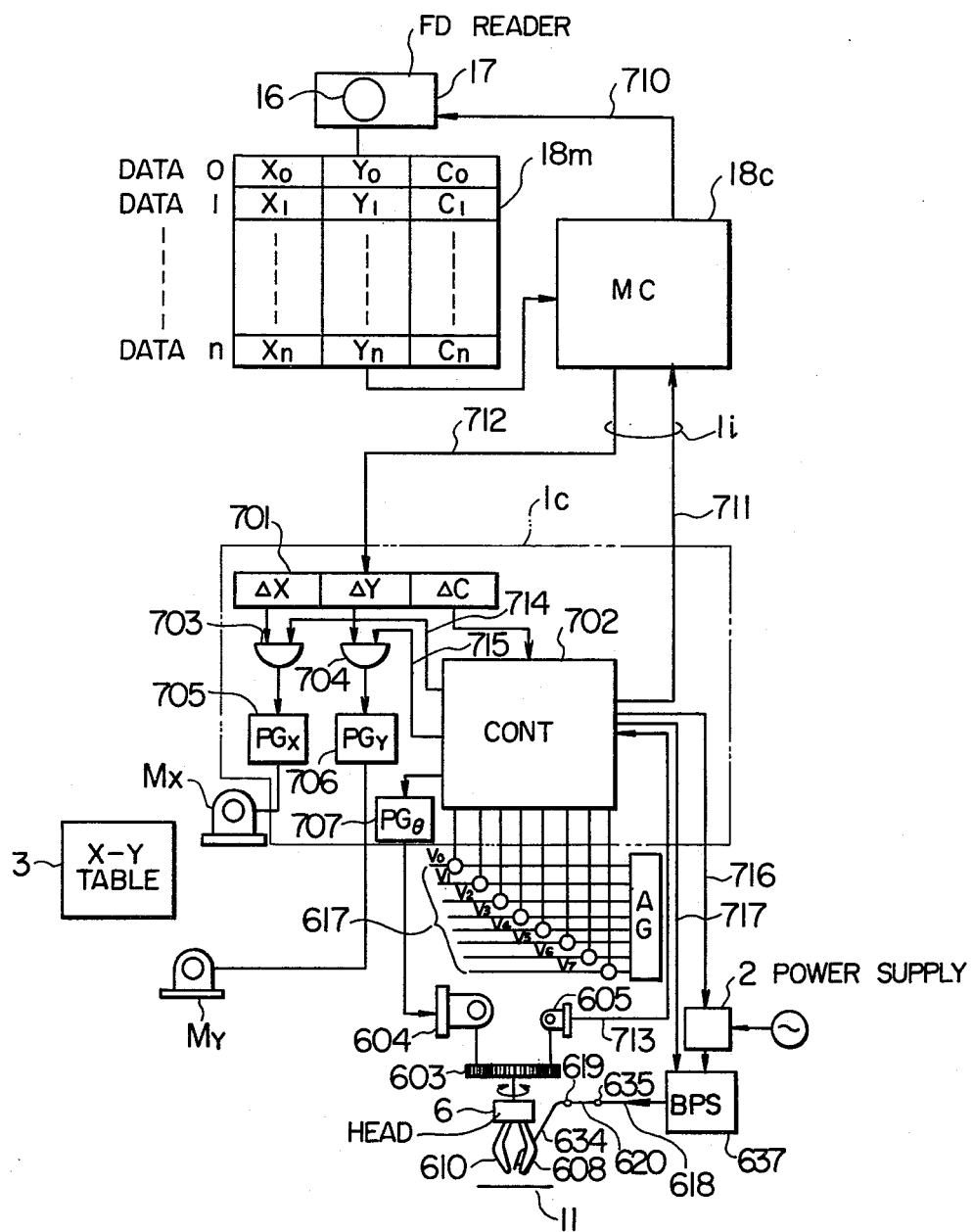
FIG. 17 is a schematic circuit diagram of a logical arrangement incorporated in the machine.

To cut away the lefthand end of the wire 664 as shown in FIG. 5, air pressure is addmitted to the pipe $Ab_4$ as shown in FIG. 8, causing the cylinder 643 to push down the cutter arm 653 (step ㉘ of FIG. 16). The transmission of air pressure to the individual cylinders has already been detailed repeatedly in the foregoing and the cylinder as operated under the application of air pressure will be described in the following description for avoiding prolixity. As the cutter arm 653 is lowered, the cutter 652 cuts away the lefthand end of the wire 664 as shown in FIG. 5, thus completing an inter-pad wiring. After a predetermined time duration, air pressure within the cylinder 643 is reduced and the cutter arm 653 is raised by the action of a spring, not shown, (step ㉙). Air pressure is then admitted to the pipe Ab$_2$ as shown in FIG. 8 and the bonding unit 607 and cutter unit 609 are raised by the action of the cylinder 641 (step ㉚).

Subsequently, air pressure is admitted to the pipe AW$_2$ as shown in FIG. 6 and the cylinder 660 raises the wire guide carrier 675 (step ㉛).

Thereafter, the MC 18c as shown in FIG. 7 examines the presence or absence of the subsequent data, data 2 (not shown), in the memory 18m (step ㉜). In the presence of the data, the program is returned to the initial step ① of FIG. 16 and the operation as set forth hereinbefore is repeated until processing of the final data is completed. In the absence of the data stored in the memory 18m, the MC instructs the FD reader 17 to read out a new wiring data (for example, 64 words) and writes into the memory 18m the new data by which the operation starting from start ① of FIG. 16 is repeated. When all the wiring data in the floppy disk 16 is executed, the wiring operation terminates.

Although, in the foregoing embodiment, the wiring data input means has been described by way of an example of the floppy disk, the data input may obviously be performed by other input means such as a paper tape, a paper card, a mark card, a mark sheet, a magnetic tape, a magnetic disk or a magnetic card. In place of temporary storage of the predetermined amount of wiring data in the internal memory (such as a core memory or IC memory), the microcomputer MC may fetch directly the data one by one from the input means. The processing of the wiring data as executed one by one by the wiring data processing means in the form of the microcomputer may also be performed by using either a combination of logical elements such as AND gates, OR gates, flip-flop circuits and the like or a microprogram. Further, in place of applying various instructions for executing steps of FIG. 16 to the controller 1c by means of the separate wiring data processing means, the function of the data processing may be incorporated into the controller 1c. Furthermore, air pressure used for mechanically actuating the individual working units may be replaced with oil pressure. Each of the working units may also be actuated magnetically by receiving an electrical signal.

As has been described, the present invention is advantageous as itemized below.

(1) With the wiring guide unit, wire cutter unit, and bonding unit arranged around the rotary head such that the acting point of these working units on the surface of the printed circuit board subject to wiring is concentrated on the axis of the rotary head, the wiring can be performed at accurately positioned sites;

(2) With the optical pipe for monitoring passed through the rotary head supporting the working units, the state of wiring working can be monitored visually with high accuracies;

(3) By the provision of the controller for controlling the operation of the individual working units and the means for sequentially supplying the wiring information to the controller, unerring and automatic wirings can be assured;

(4) By supplying the wiring data by way of the memory for storage of the predetermined amount of the wiring data, the subsequent operation can be prepared in advance, thereby reducing time for the wiring working;

(5) With the wire guide at the tip of the wire guide unit inclined with respect to the printed circuit board surface plane by a small angle, the wire conductor for wiring can be payed out smoothly, thereby reducing time for the wiring working and preventing breakage and damage of the wire conductor;

(6) By lowering the bonding tip in such a seesaw motion as this bonding tip comes across the printed circuit board surface along the normal thereof, the bonding tip will not deviate laterally from an aimed bonding site and accurate bonding thereat can be assured; and (7) With the bonding tip normally biased downwardly by depression force of the spring and allowed to rise under the application of air pressure, the wire can be applied with uniform depression force by the bonding tip and uniform bonding connections can be assured.

What is claimed is:

1. An automatic wiring machine for a printed circuit board comprising an X-Y table carrying the printed circuit board to be applied with wirings and movable in X and Y directions, and a head located above said X-Y table and rotatably supported by a main console of the machine to rotate about an axis perpendicular to the surface of said X-Y table, said head being mounted with a wire guide unit for guiding the feed of a wire for wiring to the surface of said printed circuit board, a bonding unit for bonding at a bonding point the wire fed from said wire guide unit to a conductor pattern on said printed circuit board by heating and depressing the fed wire, and a cutter unit for cutting away the wire at a site deviating from said bonding point to said wire guide unit, said wire guide, bonding and cutting units being mounted on said head for linear movement along lines which are inclined with respect to said axis, and the acting points of said wire guide, bonding and cutter units on the printed circuit board being substantially concentrated on said axis; further comprising a monitoring optical pipe for visual monitoring of the printed circuit board surface, said optical pipe passing along the rotation axis of said head.

2. An automatic wiring machine according to claim 1, further comprising a controller for controlling the motion of said X-Y table in the X and Y directions and the operation of each of said wire guide, bonding and cutter units, and wiring information supply means for sequentially supplying wiring information to said controller.

3. An automatic wiring machine according to claim 2, wherein said wiring information supply means includes a memory for temporary storage of a predetermined amount of the wiring information data, and input means for applying the predetermined amount of the wiring information data to said memory.

4. An automatic wiring machine according to claim 1, wherein said wire guide unit includes a wire guide for supply and guide of the wire for wiring, said wire guide being inclined with respect to the printed circuit board surface for facilitating pay-out of the wire.

5. An automatic wiring machine according to claim 1, wherein said bonding unit includes a bonding arm having one end pivoted at a fulcrum on said bonding unit and the other end mounted with a bonding tip, said bonding arm being operable to perform a seesaw motion in addition to said linear movement, so that said bonding tip pushes down the wire along the normal of the printed circuit board surface.

6. An automatic wiring machine according to claim 5, wherein said bonding tip subject to the seesaw motion swings upwardly under the application of air pressure and downwardly by the action of spring force.

* * * * *